United States Patent [19]
Cosley

[11] Patent Number: 5,553,394
[45] Date of Patent: Sep. 10, 1996

[54] RADIAL JET REATTACHMENT NOZZLE HEAT SINK MODULE FOR COOLING ELECTRONICS

[75] Inventor: Michael Cosley, Crystal Lake, Ill.

[73] Assignee: Reliance/Comm Tech Corporation, Mayfield Heights, Ohio

[21] Appl. No.: 438,691

[22] Filed: May 11, 1995

[51] Int. Cl.$^6$ .......................... F26B 19/00; F26B 25/06; B05B 1/26
[52] U.S. Cl. .................. 34/218; 34/221; 34/224; 239/524
[58] Field of Search ............ 34/218, 221, 224; 62/62–64, 372–74; 239/524

[56] References Cited

U.S. PATENT DOCUMENTS

| | | | |
|---|---|---|---|
| 3,128,158 | 4/1964 | Colvin et al. | 34/221 |
| 4,294,021 | 10/1981 | Turnbull et al. | 34/224 |
| 4,736,529 | 4/1988 | Kramer | 34/224 |
| 5,423,248 | 6/1995 | Smith et al. | 34/224 |

OTHER PUBLICATIONS

"Interference Effects Between Two Radial Nozzles For Surface Heat Transfer Applications"; Marongiu, Maurice J. and Cosley, Michael R.; HTD–Vol. 279, Optimal Design of Thermal Systems and Components, ASME Jun. 1994.
"Studies on the Use of Radial Jet Reattachment Nozzles as Active Heat Sinks for Electronic Component Boards"; Cosley, Michael R. and Marongiu, Maurice J.; Tenth IEEE SEMI-THERM™; Aug., 1994.

Cosley And Marongiu, "Studies On The Use Of Radial Jet Reattachment Nozzles A Active Heat Sinks For Electronic Component Boards", Published Aug. 1994.
Marongiu And Cosley, "Intereference Effects Between Two Radial Nozzles For Surface Heat Transfer Applications" Was Presented Jun. 1994.
Stromblad, Marongiu And Cosley, "Experimental Studies Using A Confined Radial Nozzle" Presented Jun. 94.

Primary Examiner—John M. Sollecito
Assistant Examiner—Steve Gravini
Attorney, Agent, or Firm—Trexler, Bushnell, Giangiorgi & Blackstone, Ltd.

[57] ABSTRACT

A radial jet nozzle for use in cooling a subject body. The radial jet nozzle includes a duct communicating with a plenum and a tapered flow diverter body positioned within the duct for comtrollably diverting the flow of a heat transfer medium through the duct. Heat transfer medium flowing through the duct is controllably, radially directed away from a discharge port of the duct. Flow from the discharge port of the radial jet nozzle creates a negative pressure in an area between a head of the diverter body and target surface of the subject body. The negative pressure increases the heat transfer rate which also increases the mass flow rate without damage to the target surface thereby enhancing the convective heat transfer characteristics of the heat transfer medium. The invention also envisions a method for cooling a subject body employing a radial jet nozzle to radially direct the heat transfer medium relative to the target surface to create a negative pressure zone which enhances the performances of the heat transfer device.

15 Claims, 2 Drawing Sheets

RADIAL JET REATTACHMENT NOZZLE HEAT SINK MODULE FOR COOLING ELECTRONICS

BACKGROUND

The present invention relates to radial jet nozzles, apparatus employing one or more radial jet nozzles to improve heat transfer, and a method of heat transfer employing radial jet nozzles.

Numerous applications require cooling or reducing the temperature of a subject body in order to provide protection, increased reliability, or to maintain the subject body within a desired temperature range. In order to transfer heat from a subject body, a heat transfer medium, typically liquid or gaseous is used to remove heat from the subject body and transport it way from the subject body thereby reducing the subject body temperature or maintaining the subject body within a desired temperature range. A prior art heat transfer device may blow air in a generally uniform directional flow across a subject body in order entrain heat and transport it away from the subject body. Another variation of this type of heat transfer device is to surround the subject body with a fluid which, depending upon the fluid used, may improve the heat transfer.

As mentioned, prior art heat transfer devices typically blow air or move a liquid across a target surface of the subject body in a generally uniform direction. Uniform flow across the target surface of the subject body may be somewhat inefficient since the heat transfer capacity of the heat transfer medium is not saturated with heat energy as it passes across the target surface. In this regard, the energy spent moving the heat transfer medium may not be optimized since the maximum heat carrying capacity of the heat transfer medium is not fully exploited.

As an additional concern, prior art heat transfer devices often may damage or degrade the target surface of the subject body to be cooled. When the uniform heat transfer medium flow is imposed across the target surface, it may tend to damage the target surface. This problem, of course, is a function of the material of the target surface and the type of heat transfer medium employed. The problem, however, is exacerbated when impinging air flow or fluid flow is used. The impinging heat transfer medium flow is forced against or driven against the target surface. Depending on the force of this heat transfer medium flow, the target surface may be damaged. Therefore, it will be desirable to provide a heat transfer device which does not produce any detrimental effects on the target surface to be cooled.

As an additional consideration, prior art heat transfer devices, employing an impinging flow, tend to create or set up vibrational forces in the subject body. The impinging flow tends to drive or vibrate the surface which it initially contacts. This problem is exacerbated if there is any type of pulsation to the flow thereby magnifying the vibrational effects. Such vibrational forces may reduce the reliability of the overall heat transfer device as well as the subject body and its components.

OBJECTS AND SUMMARY

A general object satisfied by the claimed invention is to provide a radial jet nozzle for use in cooling a subject body.

Another object which may be satisfied by the claimed invention is to provide a heat transfer device employing one or more radial jet nozzles to efficiently maximize the heat transfer properties of a heat transfer medium.

Still a further object which may be satisfied by the claimed invention is to provide a heat transfer device which minimizes or prevents damage to a target surface of the subject body.

Yet a further object which may be satisfied by the claimed invention is to provide a method for transferring heat from a subject body to a heat transfer medium employing a radial jet nozzle.

Briefly, and in accordance with the foregoing, the present invention envisions a radial jet nozzle for use in cooling a subject body. The radial jet nozzle includes a duct communicating with a plenum and a tapered, flow diverter body positioned within the duct for controllably diverting the flow of a heat transfer medium through the duct. Heat transfer medium flowing through the duct is controllably, radially directed away from a discharge port of the duct. Flow from the discharge port of the radial jet nozzle creates a negative pressure in an area between a head of the diverter body and target surface of the subject body. The negative pressure increases the heat transfer rate which also increases the mass flow rate without damage to the target surface thereby enhancing the convective heat transfer characteristics of the heat transfer medium. The invention also envisions a method for cooling a subject body employing a radial jet nozzle to radially direct the heat transfer medium relative to the target surface to create a negative pressure zone which enhances the performances of the heat transfer device.

BRIEF DESCRIPTION OF THE DRAWINGS

The organization and manner of the structure and function of the invention, together with further objects and advantages thereof, may be understood by reference to the following description taken in connection with the accompanying drawings, wherein like reference numerals identify like elements, and in which.

DESCRIPTION

Figure 1:
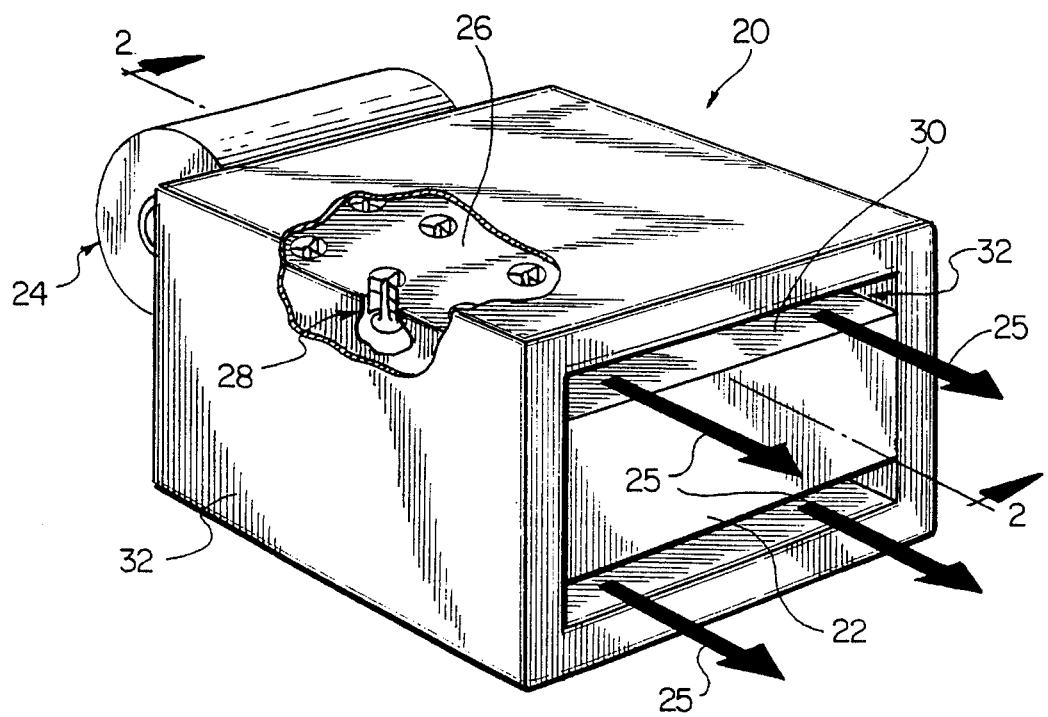
FIG. 1 is a partial fragmentary, perspective view of a generalized illustration of a subject body which cooled by a heat transfer device employing a plurality of radial jet nozzles of the present invention.

While the present invention may be susceptible to embodiment in different forms, there is shown in the drawings, and herein will be described in detail, an embodiment with the understanding that the present description is to be considered an exemplification of the principles of the invention and is not intended to limit the invention to that as illustrated and described herein.

With reference to FIG. 1, a device 20 for cooling a subject body 22 is shown. The cooling device 20 includes a pressurizing device 24 which drives a heat transfer medium 25 into a plenum chamber 26 and through a radial jet nozzle 28.

Heat transfer medium 25 passing through the radial jet nozzle assembly 28 is driven radially away from the radial jet nozzle 28 and over a target surface 30 of the subject body 22. Heat transfer medium 25 contacting or in close proximity to the target surface 30 absorbs or takes up heat energy from the target surface 30 and then exhausts through a channel 32. This device 20 helps to reduce the temperature of the target surface 30 of the subject body 22 to cool the subject body 22 and/or maintain the subject body 22 at a desired temperature.

Figure 2:
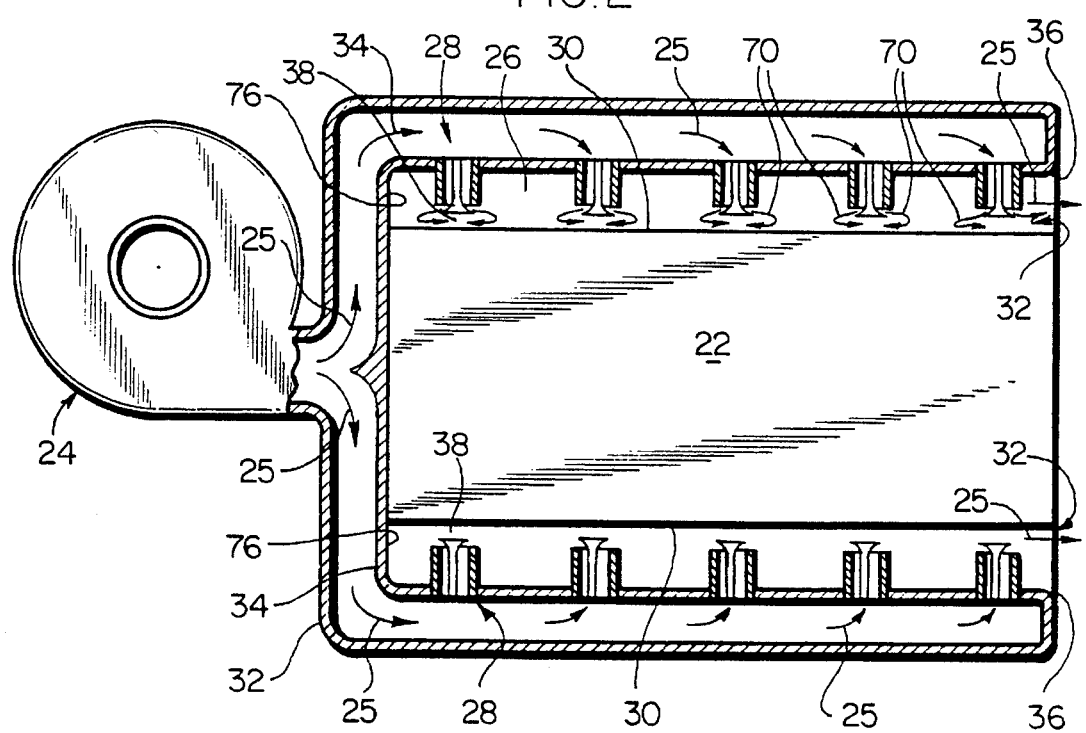
FIG. 2 is a partial fragmentary, cross-sectional, side elevational view taken along line 2—2 in FIG. 1 showing a general arrangement of a plurality of radial jet nozzles employed with the heat transfer device to cool a subject body.
Figure 4:
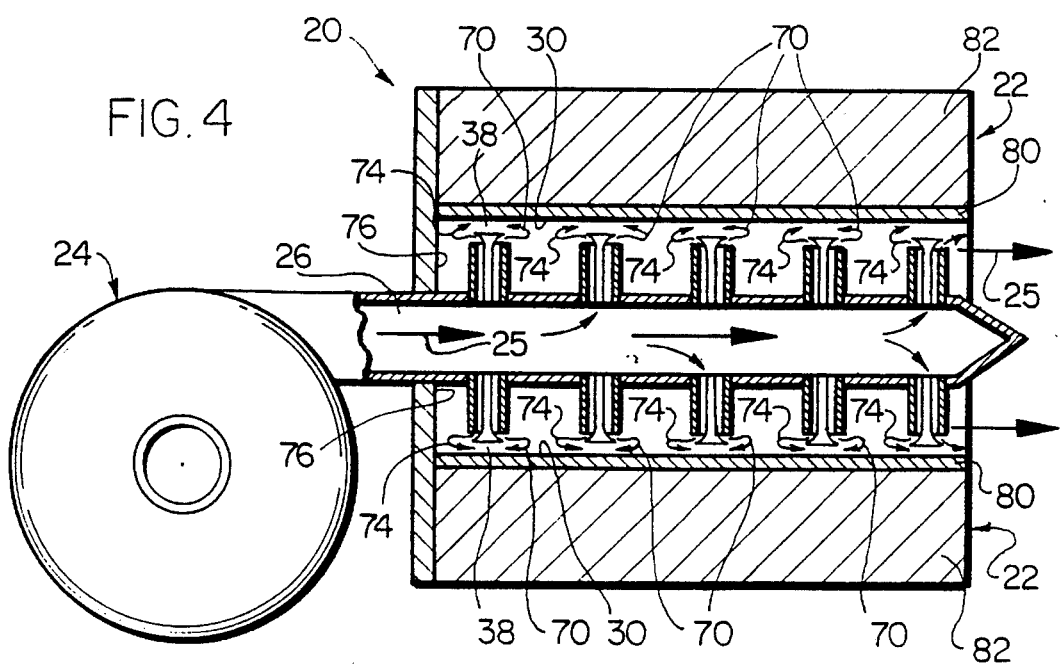
FIG. 4 is an alternate embodiment of a heat transfer device associated with a subject body.

With further reference to FIG. 2, the radial jet nozzles 28 are shown in cross-section. The plenum chamber 26 is defined between walls 32, 34 which contain the heat transfer medium 25 flow from the pressurizing device or fan 24 through the plenum chamber 26. Heat transfer medium 25 flowing through the plenum chamber 26 is forced through the radial jet nozzles 28. Heat transfer medium 25 passing through the radial jet nozzles contacts the target surface 30 of the subject body 22 and is exhausted through the distal end 36 of the channel 32. An alternate embodiment of the cooling device 20 is shown in FIG. 4. In FIG. 4 all of the radial jet nozzles 28 are connected to a single common plenum chamber 26.

In contrast, the configuration as shown in FIG. 2 routes the plenum chamber 26 on either side of a subject body 22. While these two configurations have different appearances, the radial jet nozzles 28 (as also shown in FIG. 3) in each function identically to produce a region of lower then ambient pressure in an area (38) between the radial jet nozzle 28 and the target surface 30.

Figure 3:
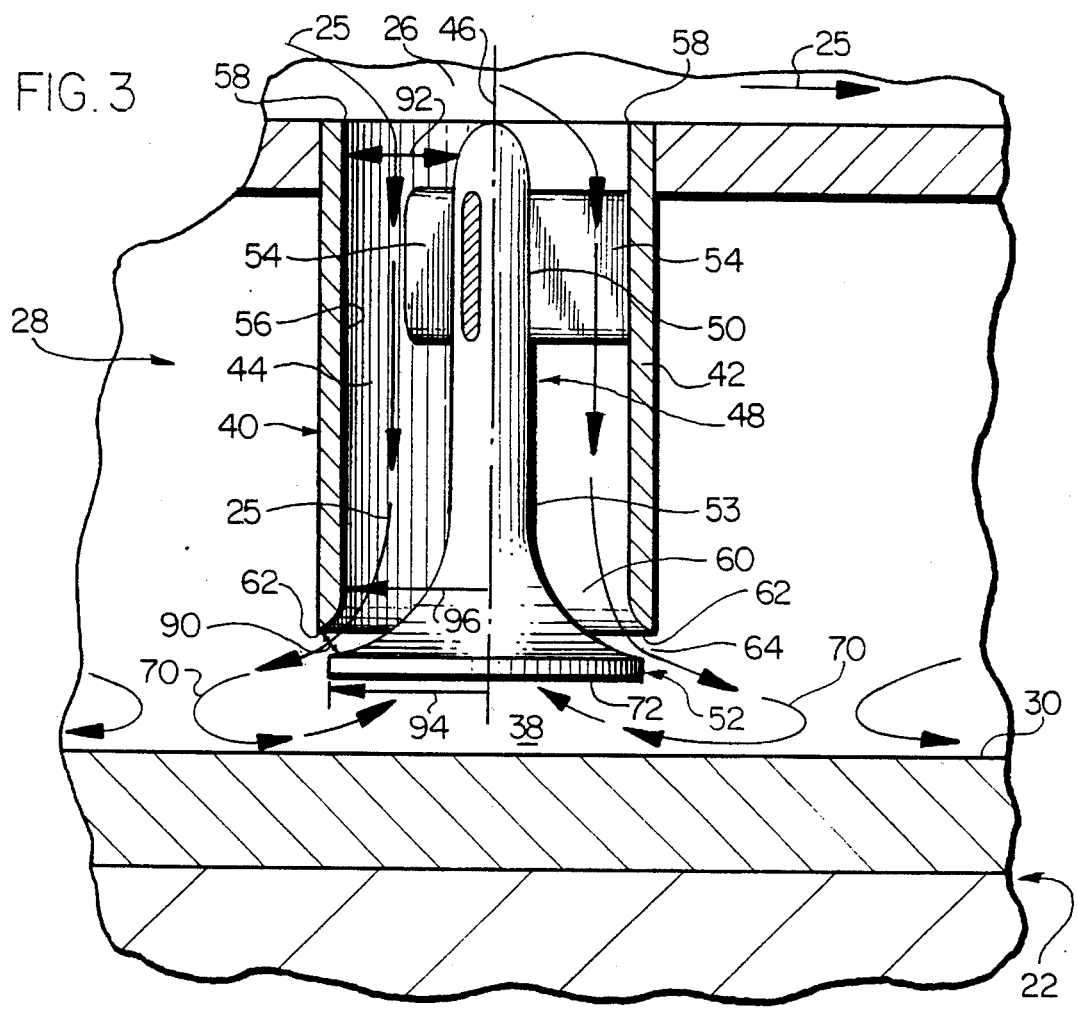
FIG. 3 is an enlarged view of one of the radial jet nozzles as shown in FIGS. 1 and 2 showing a partial fragmentary, cross-sectional side elevational view of the nozzle and the details of the structure and flow through the radial jet nozzle relative to a target surface of the subject body.

Turning now to FIG. 3, further detailed discussion of the operation of the radial jet nozzles 28 is provided. The radial jet nozzles 28 includes a duct 40 having a wall structure 42 defining a nozzle chamber 44. The duct 40 also defines a central axis 46 extending therethrough generally parallel to the wall structure 42. A flow diverter body 48 is positioned in the nozzle chamber 44 generally coincident with the central axis 46. The flow diverter body 48 includes a stem portion 50 and a head portion 52. The flow diverter body 48 has a tapered arcuate outside surface 53 which tapers from the head portion 52 towards the stem portion 50. One or more support struts 54 are attached to an inside surface 56 of the duct 40 and attached to the flow diverter body 48 for retaining the flow diverter body 48 relative to the duct 40.

Heat transfer medium 25 flowing through the plenum chamber 26 under pressure created by the pressurizing device 24 enters the radial jet nozzle 28 through an entry port 58 and is directed through the duct 40 between the inside surface 56 and the arcuate surface 53. Since the arcuate surface 53 tapers outwardly from the stem 50 towards the head portion 52 the transverse diameter of the flow diverter body 48 relatively to the central axis 46 also increases. The outward taper towards the head 52 results in a reduced chamber area 60 in an area near the head 52. Further, the head 52 flares outwardly and extends away from a discharge port 62 of the duct 40. A circumferential gap 64 is formed between the head 52 and the discharge port 62 through which the heat transfer medium 25 flowing through the duct 40 is forced. The radial jet nozzle 28 forces air outwardly in a radial direction away from the head 52 over the target surface 30.

Forcing heat transfer medium 25 through the nozzle chamber 44 and out through the circumferential gap 64 combined with the proximity of the head 52 relative to the target surface 30 creates a heat transfer medium 25 flow which produces the reduced pressure in the area 38 between the head 52 and the corresponding target surface 30. The reduced pressure enhances the convective heat transfer rates from the target surface in the local area of the radial jet nozzle 28. Heat transfer medium 25 flow (represented by the arrows (70)) tends to be radially away from the circumferential gap 64 and then curls back under towards a face 72 of the head 52. This heat transfer medium 25 flow is a phenomena which promotes the reduction in pressure in the area 38. With reference to FIGS. 2–4, the heat transfer medium 25 flow (70) is directed back towards the central axis 46 of the nozzle 28 when it impinges on oppositely directed air flow (74) or when it contacts a surface 76. The opposing heat transfer medium 25 flow is created by a field of radial jet nozzles 28 (see the partial fragmentary view as shown in FIG. 1 and FIGS. 2 and 4) which create radially directed heat transfer medium 25 flow which oppose the heat transfer medium 25 flow from neighboring nozzles 28.

The consideration of a field of radial jet nozzles 28 is important especially in practical applications since a plurality of radial jet nozzles will be needed to promote increased and efficient heat transfer from larger target surfaces. At this point it should be understood that while the present invention is disclosed showing the radial jet nozzles 28 employed to cool an enclosed, general subject body 22, the radial jet nozzles 28 will be employed in specific applications such as cooling electronics equipment, cooling plastic film during manufacture, cooling coatings, and other surface cooling or drying processes such as in the production of paper products and food processing. The present description shows the radial jet nozzles 28 being employed with a stationery subject body 22 but it should be understood from the preceding description of applications for the radial jet nozzles 28 that the target surface 30 of the subject body 22 may be moving such as in a manufacturing process or other such situation. Therefore, it should be understood that the radial jet nozzles 28 as disclosed herein may be readily applied to a broad range of devices and processes.

The radial jet nozzle 28 also provides the benefits of reduced force on the target surface 30 compared to impinging open jet nozzles as used in the prior art. The reduced force on the target surface results from the generally radial somewhat parallel, initial flow of the heat transfer medium 25 discharged through the circumferential gap 64 relative to the target surface 30. As such, the radial jet nozzles 28 create a positive force, as a result of the negative pressure in the area 38 on the target surface 30. Reducing the forces on the target surface 30 further reduces the vibrational effects of the heat transfer medium 25 flow (70) on the subject body 22. As an additional consideration, the turbulent churning flow (70) tends to saturate with a greater quantity of heat energy since it typically passes close to the surface 30 of the target body 22 more than one time. This is in contrast to prior art directly impinging nozzles which tended to make a single pass over the surface 30. Another effect of the reduced dimension circumferential gap formed between the discharge port 62 and the head 52 is that the heat transfer medium 25 flowing therethrough increases in velocity. So while the flow may become more turbulent after exhausted from the nozzle 28 the increased velocity tends to move the heat transfer medium 25 quickly, thereby quickly exhausting the heat saturated heat transfer medium 25 away from the subject body 22.

Specific spacing between radial jet nozzle 28 and the face 72 of flow diverter body 48 relative to the target surface 30 may be determined by empirical experimentation based on the subject body 22 to be cooled. As such, the radial nozzles 28 may be brought close together or spread further apart to effect the interaction between the flow from each specific radial jet nozzles 28 and the face 72 may be brought closer or moved away from the target surface 30. As neighboring nozzles are spread further apart the pressure levels associated with each nozzle tend to decrease.

A more specific example of the application as shown in FIG. 2 would be to employ the present invention in a cable television application in which a number of cable television connection components are retained in the subject body 22. Since these components may create a substantial amount of heat and tend to be enclosed and environmentally sealed within a container such as the subject body 22, it is important to remove heat from the subject body 22 while maintaining the subject body in a sealed or closed state. As such, the radial jet nozzles 28 are very valuable in removing heat from applications which cannot allow a heat transfer medium 25 such as air or fluid to pass therethrough. In the situation as shown in FIG. 2, the radial jet nozzles 28 are configured in communication with a plenum chamber 26 for directing heat transfer medium 25 flow against the subject surface 30. The heat transfer medium 25 flowing from the radial jet nozzles 28 is forced from one end of the configuration towards the distal end 36 whereby it is exhausted through the openings in the distal end 36. The radial jets increase the heat transfer efficiency in this application and eliminate the need for conventional air conditioning systems which employ coolants and are of substantially greater complexity than the cooling device 20 of the present invention employing the radial jets 28.

The configuration as shown in FIG. 4 may be particularly useful in applications which include an electrical power supply or rectifier. In this application, electrical components are mounted to a substrate 80 which has desirable heat transfer characteristics. The electrical components may be embedded or "potted" in a compound (82) to protect the components and further enhance heat transfer characteristics. As heat is generated by the components it is transferred to the substrate 80 which acts as a heat sink. The heat is generally evenly distributed to the substrate 80 whereby it is acted upon by the heat transfer medium 25 flow from the radial jet nozzles 28 and heat energy is transferred to the heat transfer medium 25. This manner of cooling the electrical components prevents the heat transfer medium 25 from interacting with the components while providing a highly efficient heat transfer mechanism.

In use, the system for cooling employing the radial jet nozzles 28 of the present invention includes the pressurizing device 24 which communicates with the plenum 26 to transport heat transfer medium 25 from the pressurizing device 24 through the plenum 26 and to the radial jet nozzles 28. Heat transfer medium 25 flowing through the entry port 58 of the duct 40 flows through the nozzle chamber 44 and out through the circumferential gap 64 formed between the discharge port 62 and the head portion 52. The circumferential gap 64 has a dimension 90 which is substantially less than dimension 92 measured between an outside surface of the stem 50 and an inside surface 56 of the duct 40 near the entry port 58. The reduced dimension 90 results in increased velocity of the heat transfer medium 25 flowing through the gap 64. Additionally, the discharge surfaces of the discharge port 62 are curved to complement the arcuate surface 53 of the diverter body 48 facilitating a smooth exit through the gap 64. Further, it should be noted that the head portion 52 extends outwardly away from the discharge port 62 and also has a radial dimension 94 which is greater than a corresponding radial dimension 96 measured between the central axis and an inside surface 56 of the duct 40. The differentiation between the dimensions 94 and 96 help to facilitate a outwardly radial flow of the heat transfer medium 25 away from the radial jet nozzle 28.

Heat transfer medium 25 flowing through the radial jet nozzle 28 flows outwardly away therefrom and tends to be cured downwardly towards the face surface 72 of the head portion 52. This downward "curling under" of the heat transfer medium 25 flow tends to create a negative pressure in the area (38) between the head 52 and the target surface 30. This phenomena of the radial jet nozzle facilitates increased heat transfer from the subject body to the heat transfer medium 25 and also reduces the detrimental effects of heat transfer medium 25 flowing over the target surface 30. Further, this flow pattern increases the turbulence of the heat transfer medium 25 in the channel 32 and thereby increases the saturation rate of heat energy in the heat transfer medium 25 thereby optimizing the function of the heat system and efficiency of heat removal from the subject body.

While a preferred embodiment of the present invention is shown and described, it is envisioned that those skilled in the art may devise various modifications of the present invention without departing from the spirit and scope of the appended claims. The invention is not intended to be limited by the foregoing disclosure.

The invention claimed is:

1. A radial jet nozzle assembly for use in cooling subject bodies, said radial jet nozzle assembly directing heat transfer medium flow across a target surface of said subject body to increase said heat transfer from the subject body to the heat transfer medium flow to improve the cooling of said subject body, said radial jet nozzle assembly comprising:

an axially oriented duct having at least one wall defining an entry port, a discharge port, and a nozzle chamber therebetween, heat transfer medium passing from said entry port through said nozzle chamber and out through said discharge port;

a flow diverter body generally coaxially positioned in said duct, said flow diverter body having a tapered surface for directing heat transfer medium flow passing through said nozzle chamber radially outwardly away from said duct at said discharge port; and support struts attached to and extending between an inside surface of said duct and an outside surface of said flow diverter body for supporting said flow diverter body in said heat transfer medium flow in said nozzle chamber.

2. A radial jet nozzle assembly as recited in claim 1, wherein said heat transfer medium is gaseous.

3. A radial jet nozzle assembly for use in cooling subject bodies, said radial jet nozzle assembly directing a liquid heat transfer medium flow across a target surface of said subject body to increase said heat transfer from the subject body to the heat transfer medium flow to improve the cooling of said subject body, said radial jet nozzle comprising:

a duct having at least one wall defining an entry port, a discharge port, and a nozzle chamber therebetween, heat transfer medium passing from said entry port through said nozzle chamber and out through said discharge port;

a flow diverter body positioned in said duct, said flow diverter body having a tapered surface for directing heat transfer medium flow passing through said nozzle chamber radially outwardly away from said duct at said discharge port; and support struts extending between an inside surface of said duct and an outside surface of said flow diverter body for supporting said flow diverter body in said heat transfer medium flow in said nozzle chamber.

4. A radial jet nozzle assembly, for use in cooling subject bodies, said radial jet nozzle assembly directing heat transfer medium flow across a target surface of said subject body to increase said heat transfer from the subject body to the heat transfer medium flow to improve the cooling of said subject body, said radial jet nozzle comprising:

a duct having at least one wall defining an entry port, a discharge port, and a nozzle chamber therebetween, heat transfer medium passing from said entry port through said nozzle chamber and out through said discharge port;

a flow diverter body positioned in said duct, said flow diverter body having a tapered surface for directing heat transfer medium flow passing through said nozzle chamber radially outwardly away from said duct at said discharge port, said flow diverter body includes a stem portion and a head portion, an arcuate surface being defined by said stem portion and head portion; and support struts extending between an inside surface of said duct and an outside surface of said flow diverter body for supporting said flow diverter body in said heat transfer medium flow in said nozzle chamber.

5. A radial jet nozzle assembly as recited in claim 4, wherein said head portion extends from said discharge port of said duct, said head portion and said discharge port defining a gap therebetween, said flow diverter body and said duct of said radial jet nozzle assembly directing heat transfer medium flow outwardly generally radially away from said radial jet nozzle assembly.

6. A radial jet nozzle assembly as recited in claim 5, wherein said gap defines a dimension between said head portion and said discharge port which is substantially less than a dimension between an inside surface of said duct and said stem portion for increasing the velocity of the heat transfer medium flowing through said gap.

7. A radial jet nozzle assembly for use in cooling subject bodies, said radial jet nozzle assembly directing heat transfer medium flow across a target surface of said subject body to increase said heat transfer from the subject body to the heat transfer medium flow to improve the cooling of said subject body, said radial jet nozzle comprising:

a duct having at least one wall defining an entry port, a discharge port, and a nozzle chamber therebetween, heat transfer medium passing from said entry port through said nozzle chamber and out through said discharge port, said duct defines a central axis extending therethrough, said duct and said flow diverter body being generally symetrically defined about said central axis with said flow diverter body being coaxially positioned in said nozzle chamber of said duct;

a flow diverter body positioned in said duct, said flow diverter body having a tapered surface for directing heat transfer medium flow passing through said nozzle chamber radially outwardly away from said duct at said discharge port, said flow diverter body including a stem portion and a head portion forming a continuous arcuate surface tapering outwardly from said stem portion to said head portion, said head portion extending beyond said discharge port and having a radial dimension which is greater than a corresponding radial dimension measured at an inside surface of said duct; and support struts extending between an inside surface of said duct and an outside surface of said flow diverter body for supporting said flow diverter body in said heat transfer medium flow in said nozzle chamber.

8. A system for cooling a subject body including a plurality of radial jet nozzle assemblies for directing heat transfer medium flow across a target surface of the subject body for increasing heat transfer from the subject body to said heat transfer medium flow, said system comprising:

a pressurizing device for pressurizing heat transfer medium in the system;

a plenum communicating with said pressurizing device for directing heat transfer medium from said pressurizing device towards a subject body;

a plurality of radial jet nozzles attached to said plenum for controllably directing the flow of heat transfer medium from said plenum to a channel proximate to said subject body; and each radial jet nozzle including a duct having an entry port communicating with said plenum and a discharge port communicating with said channel, a flow diverter body retained in said duct for controllably directing flow from said plenum through said duct radially, outwardly from said discharge port proximate to said subject body;

whereby heat transfer medium flowing from said pressurizing device through said plenum and through said radial jet nozzle is radially, outwardly forced from said duct of said radial jet nozzle over a target surface of said subject body for entraining heat energy from said target surface and transporting said heat energy away from said subject body.

9. A system for cooling as recited in claim 8, wherein said heat transfer medium is gaseous.

10. A system for cooling as recited in claim 8, wherein said heat transfer medium is liquid.

11. A system for cooling as recited in claim 8, wherein said flow diverter body includes a stem portion and a head portion, an arcuate surface being defined by said stem portion and head portion.

12. A system for cooling as recited in claim 11, wherein said head portion extends from said discharge port of said duct, said head portion and said discharge port defining a gap therebetween, said flow diverter body and said duct of said radial jet nozzle assembly directing heat transfer medium flow outwardly generally radially away from said radial jet nozzle assembly.

13. A system for cooling as recited in claim 12, wherein said gap defines a dimension between said head portion and said discharge port which is substantially less than a dimension between an inside surface of said duct and said stem portion for increasing the velocity of the heat transfer medium flowing through said gap.

14. A system for cooling as recited in claim 8, wherein said duct defines a central axis extending therethrough, said duct and said flow diverter body being generally symetrically defined about said central axis with said flow diverter body being coaxially positioned in said nozzle chamber of said duct;

said flow diverter body including a stem portion and a head portion forming a continuous arcuate surface tapering outwardly from said stem portion to said head portion; and said head portion extending beyond said discharge port and having a radial dimension which is greater than a corresponding radial dimension measured at an inside surface of said duct.

15. A radial jet nozzle assembly for use in cooling subject bodies, said radial jet nozzle assembly directing heat transfer medium flow across a target surface of said subject body to increase the heat transfer from said subject body to the heat transfer medium flow to improve the cooling of said subject body, said radial jet nozzle assembly comprising:

- an axially oriented, generally cylindrical duct having at least one wall defining an entry port, a discharge port, and a nozzle chamber therebetween, heat transfer medium passing from said entry port through said nozzle chamber to said discharge port;
- a generally axially symetrical flow diverter body generally coaxially positioned in said duct, said flow diverter body having a tapered surface for directing heat transfer medium flow passing through said nozzle chamber radially outwardly away from said duct at said discharge port; and
- support struts attached to and extending between an inside surface of said duct and an said tapered surface of said flow diverter body for retaining said flow diverter body in said heat transfer medium flow through said nozzle chamber.

* * * * *